(12) United States Patent
Pu et al.

(10) Patent No.: US 10,490,441 B1
(45) Date of Patent: Nov. 26, 2019

(54) SILICON ISLAND STRUCTURE AND METHOD OF FABRICATING SAME

(71) Applicant: Nexchip Semiconductor Corporation, Hefei (CN)

(72) Inventors: Tiansong Pu, Hefei (CN); Ching-Ming Lee, Hefei (CN); Hsin-Chuan Chen, Hefei (CN)

(73) Assignee: NEXCHIP SEMICONDUCTOR CORPORATION, Anhui, Hefei (CN)

( * ) Notice: Subject to any disclaimer, the term of this patent is extended or adjusted under 35 U.S.C. 154(b) by 0 days.

(21) Appl. No.: 16/164,024

(22) Filed: Oct. 18, 2018

(30) Foreign Application Priority Data

Aug. 23, 2018 (CN) .......................... 2018 1 0968228

(51) Int. Cl.
  *H01L 21/762* (2006.01)
  *H01L 21/763* (2006.01)
(52) U.S. Cl.
  CPC ...... *H01L 21/76283* (2013.01); *H01L 21/762* (2013.01); *H01L 21/763* (2013.01); *H01L 21/76208* (2013.01); *H01L 21/76248* (2013.01); *H01L 21/76264* (2013.01); *H01L 21/76267* (2013.01)
(58) Field of Classification Search
  CPC ......... H01L 21/76264; H01L 21/76283; H01L 21/76267; H01L 21/76248; H01L 21/76208; H01L 21/762; H01L 21/763; H01L 27/0605; H01L 29/735; H01L 29/6625
  USPC ........ 257/522, 347, 369, 419, 629, E21.218, 257/E21.223, E21.231, E21.544, E21.551, 257/E21.566, E21.571, E21.572, E27.056, 257/E27.057, E27.062, E29.044, E29.114, 257/E29.183, E29.287; 438/219, 311, 438/337, 370, 404, 410, 412, 429, 430
  See application file for complete search history.

(56) References Cited

U.S. PATENT DOCUMENTS

| 4,580,331 | A | * | 4/1986 | Soclof | H01L 21/265 |
| | | | | | 257/559 |
| 4,685,198 | A | * | 8/1987 | Kawakita | H01L 21/762 |
| | | | | | 148/DIG. 115 |
| 6,362,070 | B1 | * | 3/2002 | Villa | H01L 21/02238 |
| | | | | | 257/E21.258 |

(Continued)

*Primary Examiner* — Dao H Nguyen
(74) *Attorney, Agent, or Firm* — Muncy, Geissler, Olds & Lowe, P.C.

(57) ABSTRACT

A silicon island structure and a method of fabricating same are disclosed. The method includes: forming multiple first trenches in a silicon substrate; forming second trenches by partially filling some of the first trenches with an insulating material; depositing a protective layer over the silicon substrate and over the second trenches; removing the protective layer over bottoms of the second trenches and the insulating material under the second trenches, thereby exposing sidewalls of some first trenches; oxidizing portions of the silicon substrate between the exposed sidewalls of the first trenches to form an oxide layer; removing the protective layer covering sidewalls of the second trenches; and filling the second trenches with an isolating material to form isolations, wherein portions of the silicon substrate between the isolations define silicon islands. This method enables the formation of silicon islands at desired locations with reduced process complexity and cost.

11 Claims, 5 Drawing Sheets

(56) References Cited

U.S. PATENT DOCUMENTS

| | | | |
|---|---|---|---|
| 6,455,391 B1 * | 9/2002 | Villa | H01L 21/76208 |
| | | | 257/E21.554 |
| 9,390,982 B2 * | 7/2016 | Ko | H01L 27/0922 |
| 10,083,856 B2 * | 9/2018 | Chern | H01L 21/76283 |

* cited by examiner

SILICON ISLAND STRUCTURE AND METHOD OF FABRICATING SAME

CROSS-REFERENCE TO RELATED APPLICATIONS

This application claims the priority of Chinese patent application number 201810968228.8 filed on Aug. 23, 2018, the entire contents of which are incorporated herein by reference.

TECHNICAL FIELD

The present invention relates to the integrated circuit (IC) fabrication technology and, in particular, to a silicon island structure and a method of fabricating the same.

BACKGROUND

In recent years, with the development of semiconductor IC fabrication technology, the number of components in a single chip has been increasing, and the size of such components has been shrinking due to increasingly higher integration, compressing the IC line width to the order of micrometers. However, no matter how the component size is reduced, individual components in a single chip must be properly insulated or isolated from one another, in order for good properties of the components to be achieved. This is usually accomplished by a so-called component isolation technique which aims essentially to form isolations between individual components, which ensures a desired isolation effect while having a minimized footprint so as to leave more chip real estate such that a greater number of components can be accommodated.

In the semiconductor fabrication technology of the state of the art, a silicon-on-insulator (SOI) technique is often employed to achieve a good isolation. This technique allows effective improvements in body effects resulting from feature size reductions of semiconductor devices. Alternatively, insulating silicon islands formed in predetermined regions by depositing and polishing polysilicon and then flipping over the substrate can provide a complete isolation. Both of these techniques are associated with a high process complexity, a high cost and a long manufacturing cycle.

FIGS. 1 to 4 are schematics illustrating individual steps in a method for fabricating a silicon island structure. As shown in figures, the method includes:

at first, providing a silicon substrate 10, forming a plurality of trenches 11 therein and depositing an oxide layer 12 which covers sidewalls and bottoms of the trenches 11 as well as the silicon substrate 10, resulting in a structure as shown in FIG. 1;

subsequently, depositing a polysilicon layer 13 that covers the silicon substrate 10 and fills the trenches 11, as shown in FIG. 2;

after that, planarizing the surface of the polysilicon layer 13 by chemical mechanical polishing (CMP), as shown in FIG. 3; and at last, flipping over the silicon substrate 10 and performing a CMP process on the side of the silicon substrate 10 that has not been processed until the oxide layer 12 is exposed. As a result, in the remainder of the silicon substrate 10, there is a plurality of silicon islands 14 that are completely isolated from one another by the trenches 11, as shown in FIG. 4.

However, this method involves two CMP processes (respectively on the polysilicon layer 13 and on the flipped silicon substrate 10) which are subject to accuracy limitations and are associated with low uniformity controllability. In particular, in the second CMP process subsequent to the flipping of the silicon substrate 10, it tends to occur that part of the oxide layer 12 is exposed or even removed, with the remainder of the oxide layer still being buried beneath the silicon substrate, which will impose an adverse impact on the performance of the formed silicon islands. Moreover, after the silicon islands 14 are formed, in order to provide the silicon substrate with a support, it is further required to bond a carrier substrate to its bottom side (i.e., the side closer to the silicon islands 14). This bonding step, coupled with the two CMP processes, makes the conventional method suffer from a high process complexity, a high cost and a long manufacturing cycle.

On the other hand, the SOI technique usually involves an ion implantation or a substrate bonding, which also lead to a high process complexity, a high cost and a long manufacturing cycle.

SUMMARY OF THE INVENTION

In view of the above problems, it is an object of the present invention to provide a silicon island structure and a method of fabricating the same, which allows the formation of a plurality of silicon islands that are completely isolated from one another, with a lower process complexity.

To this end, the present invention provides a method of fabricating a silicon island structure, comprising the steps of:

providing a silicon substrate and forming a plurality of first trenches in the silicon substrate;

depositing an insulating material, the insulating material at least filling bottom portions of some of the first trenches such that second trenches are formed in the some of the first trenches;

forming a protective layer which covers the silicon substrate as well as sidewalls and a bottom surface of each of the second trenches;

removing, by etching, a portion of the protective layer over the bottom surface of each of the second trenches and a portion of the insulating material under each of the second trenches so as to expose the some of the first trenches;

performing an oxidation process at portions of the silicon substrate exposed at sidewalls of the some of the first trenches until the portions of the silicon substrate between portions of the sidewalls of the first trenches that are not covered by the protective layer are completely oxidized, thereby forming an oxide layer;

removing the protective layer covering the sidewalls of each of the second trenches; and filling each of the second trenches with an isolating material so as to form an isolation therein, with each portion of the silicon substrate between the isolations defining a silicon island.

Optionally, the method may further comprise, prior to the formation of the plurality of first trenches, successively depositing a pad oxide layer and a stop layer over the silicon substrate.

Optionally, in the method, the formation of the plurality of first trenches may comprise:

forming a patterned photoresist on the stop layer; and sequentially etching through, by using the patterned photoresist serving as a mask, the stop layer, the pad oxide layer and part of the silicon substrate to form the plurality of first trenches b.

Optionally, in the method, the formation of the second trenches in the first trenches may comprise:

depositing the insulating material over the silicon substrate such that the insulating material covers the stop layer and fills the first trenches;

planarizing the insulating material until the stop layer is exposed; and etching portions of the insulating material in the some of the first trenches until a certain thickness of the insulating material is remained, so as to form the second trenches in some of the first trenches.

Optionally, in the method, each of the pad oxide layer, the insulating material and the isolating material may be formed from a material including silicon oxide, and each of the stop layer and the protective layer may be formed from a material including silicon nitride.

Optionally, in the method, portion of the protective layer over the bottom surface of each of the second trenches may be removed by dry etching, and the insulating material in each of the some of the first trenches may be removed by wet etching.

Optionally, in the method, the oxidation process performed at portions of the the silicon substrate exposed at the sidewalls of the some of the first trenches may be a wet oxidation process.

Optionally, in the method, the formation of the isolations by filling each of the second trenches with the isolating material may comprise:

depositing the isolating material such that the isolating material covers the protective layer and fills each of the second trenches;

planarizing the isolating material until the protective layer is exposed; and removing the protective layer over the silicon substrate.

Correspondingly, the present invention also provides a silicon island structure fabricated by using the method as defined above. The silicon island structure comprises:

a silicon substrate;

a plurality of isolations located within the silicon substrate, wherein each portion of the silicon substrate between adjacent ones of the plurality of isolations is defined as a silicon island; and an oxide layer, which is present within at least a portion of the silicon substrate under the isolations and the silicon islands and is in contact with the isolations.

Optionally, the silicon island structure may further comprise a pad oxide layer through which the isolations penetrate.

Optionally, in the silicon island structure, a top surface of each of the isolations may be higher than a top surface of the pad oxide layer.

Compared with the prior art, in the method of the present invention, a plurality of first trenches is first formed in a silicon substrate, and at least some of the first trenches are then partially filled with an insulating material so as to form second trenches therein. After that, a protective layer is deposited over sidewalls of each of the second trenches in order to protect the underlying silicon substrate in a subsequent oxidation process which is performed on the silicon substrate exposed at the sidewalls of the first trenches (i.e., at the portions of the sidewalls not protected by the protective layer) until the silicon substrate between the uncovered portions is completely oxidized. Finally, the protective layer covering the sidewalls of the second trenches is removed and the second trenches are filled with an isolating material so as to form isolations, with the silicon substrate between them defining silicon islands that are completely isolated from one another. With this method, silicon islands with the same properties as those formed by a SOI technique can be formed at desired locations without introducing any additional process such as ion implantation, bonding or the like to the conventional technique. Therefore, significant reductions in process complexity and cost are achievable.

DETAILED DESCRIPTION

The present invention will become more apparent and better understood from the following detailed description, which is to be read in connection with the accompanying drawings. Of course, the invention is not limited to these embodiments and all general substitutions known to those skilled in the art are intended to be also embraced in the scope of the invention.

Apparently, the embodiments set forth below are only some, but not all embodiments of the inventions. All other embodiments made by those of ordinary skill in the art based on the embodiments disclosed herein without inventive efforts fall within the scope of the present invention. In addition, the drawings are presented in a schematic fashion possibly not drawn to scale, for the sake of facilitated illustration without limiting the scope of the present invention.

Figure 1:
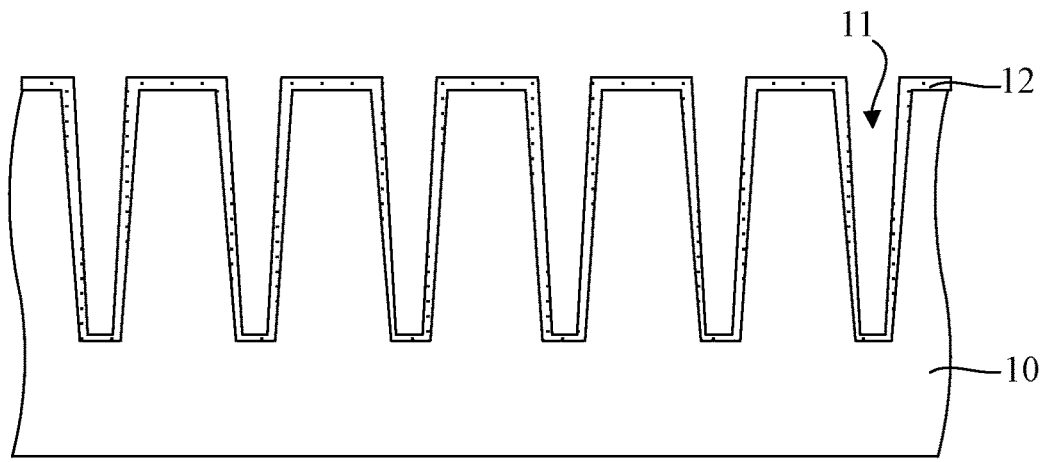
FIGS. 1 to 4 are schematics illustrating individual steps in a conventional method for fabricating a silicon island structure.
Figure 2:
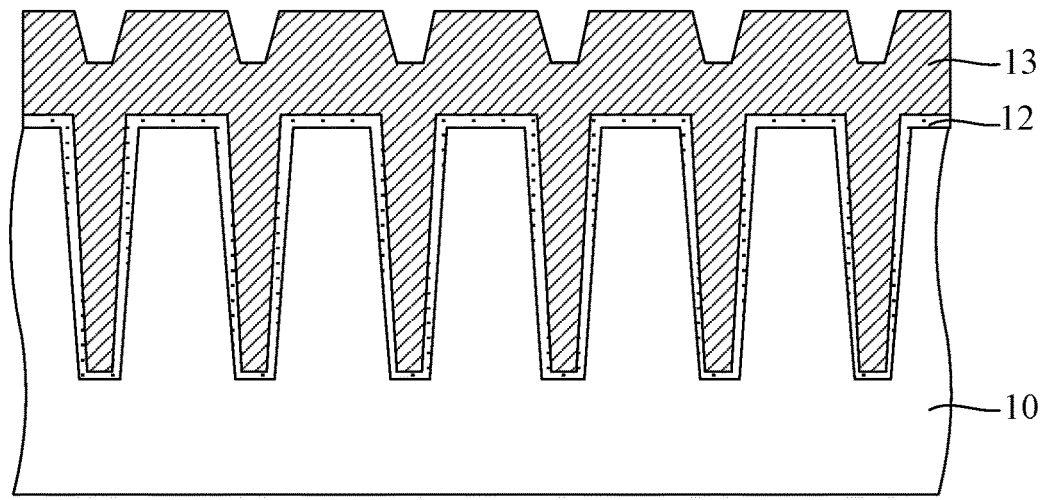
Figure 3:
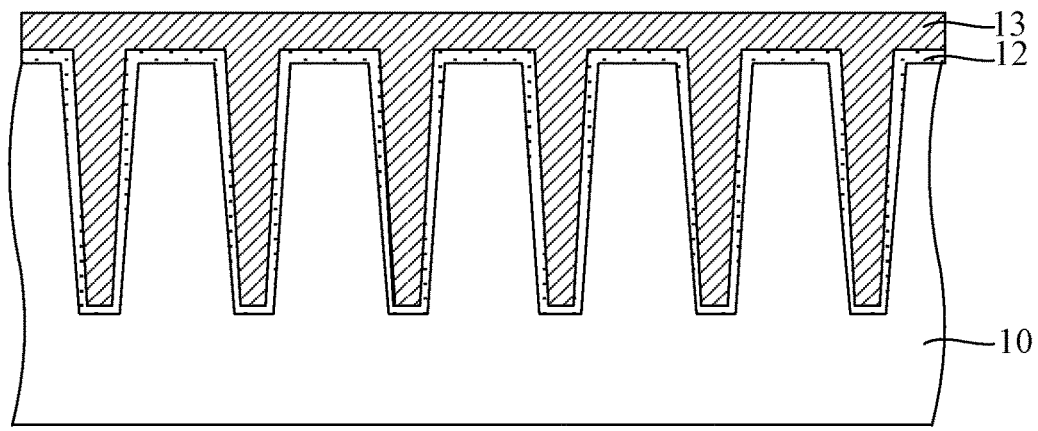
Figure 4:
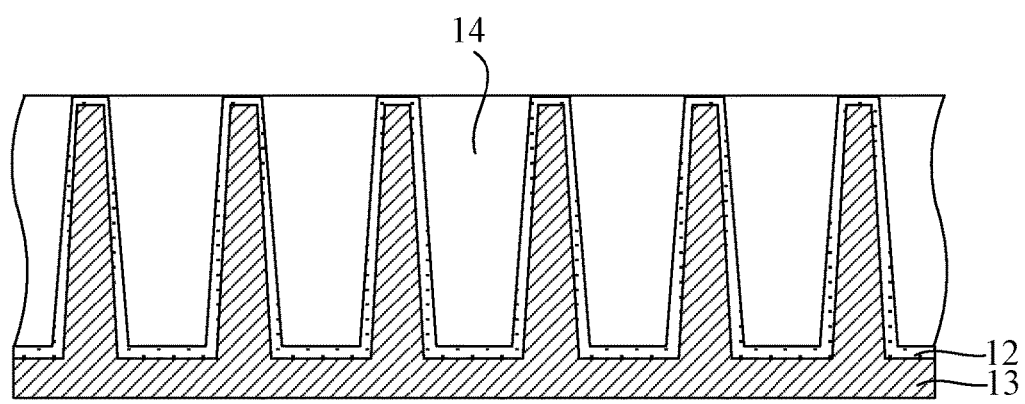
Figure 5:
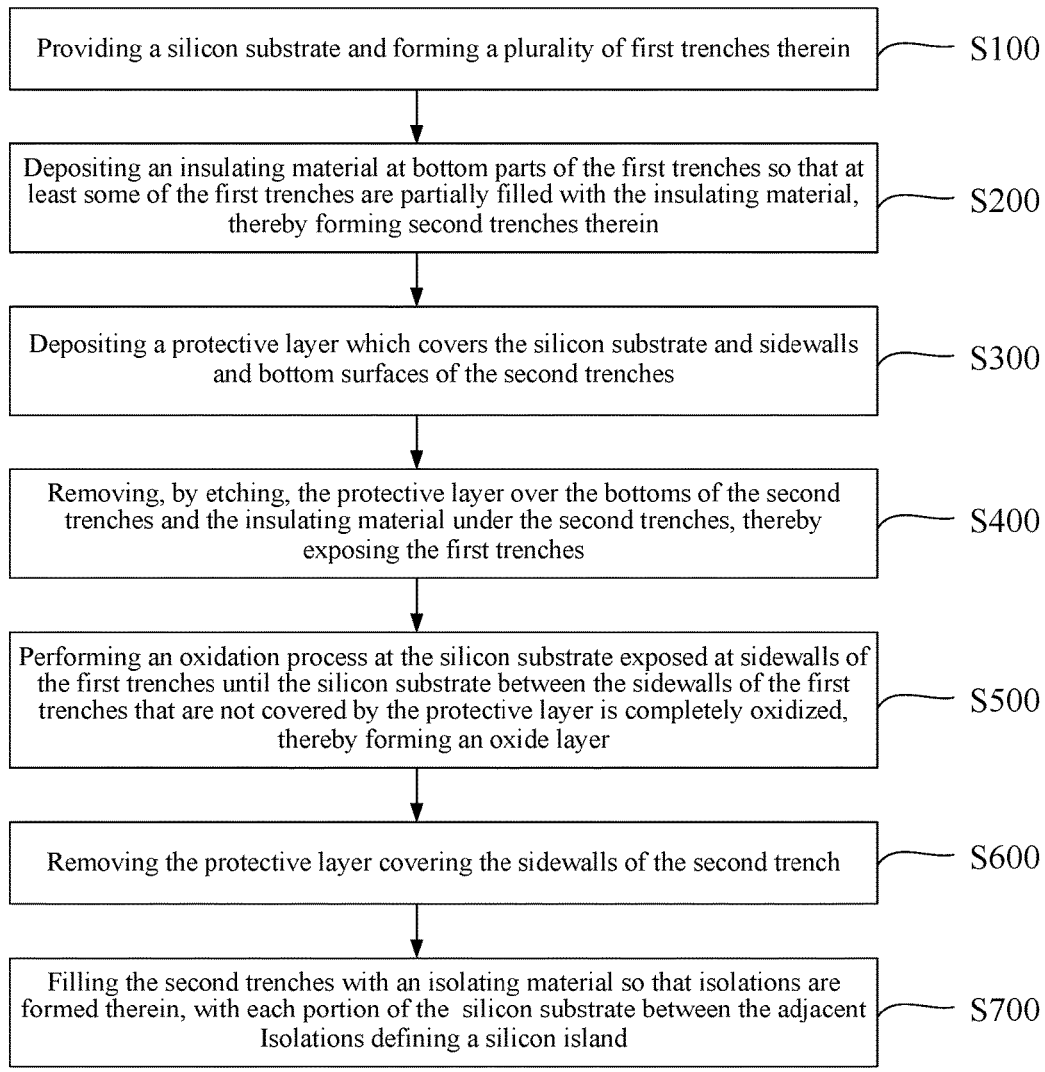
FIG. 5 is a flowchart graphically illustrating a method for making a silicon island structure in accordance with an embodiment of the present invention.

FIG. 5 is a flowchart graphically illustrating a method for fabricating a silicon island structure in accordance with an embodiment of the present invention. FIGS. 6 to 11 are schematics illustrating individual steps in a method for fabricating a silicon island structure in accordance with an embodiment of the present invention. The individual steps will be described below in greater detail with reference to FIGS. 5 to 11.

Figure 6:
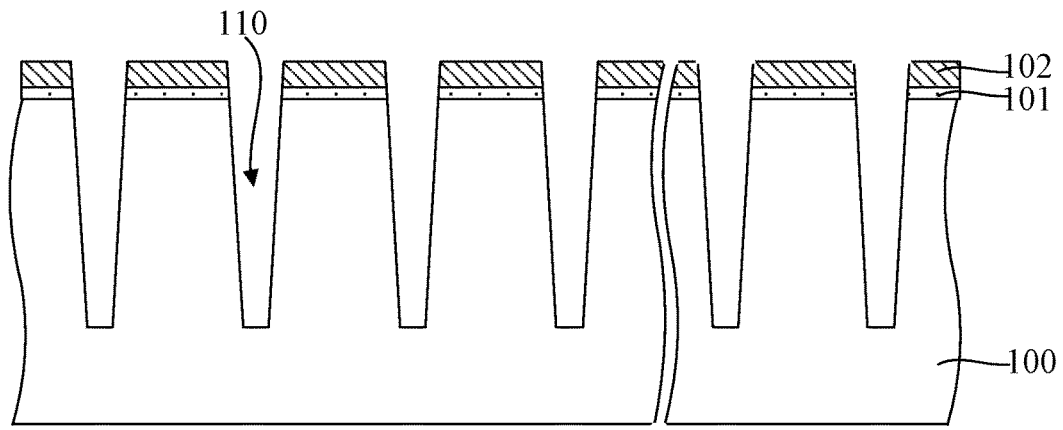
FIGS. 6 to 11 are schematics illustrating individual steps in a method for making a silicon island structure in accordance with an embodiment of the present invention.

In step S100, with reference to FIG. 6, a silicon substrate 100 formed with a plurality of first trenches 110 therein is provided.

In a preferred embodiment, prior to the formation of the first trenches 110, a pad oxide layer 101 and a stop layer 102 are successively formed over the silicon substrate 100. In particular, the pad oxide layer 101 may be first formed on the silicon substrate 100 by high-temperature oxidation and the stop layer 102 may then be formed on the pad oxide layer 101 by chemical vapor deposition. The material from which the pad oxide layer 101 is fabricated includes, but not limited to, silicon oxide. Similarly, the stop layer 102 may be made of, but not limited to, silicon nitride. The stop layer 102 is formed to protect the underlying pad oxide layer 101 and silicon substrate 100 from an etching gas used in a subsequent etching process for forming the first trenches.

Afterwards, the plurality of first trenches 110 are formed, penetrating through the stop layer 102 and the pad oxide layer 101 and terminating in the silicon substrate 100, as shown in FIG. 6. For example, photoresist may be spin-coated on the surface of the stop layer 102 and then patterned by exposure and development processes. The patterned photoresist may serve as a mask during the formation of the plurality of first trenches 110 by etching through the stop layer 102, the pad oxide layer 101 and part of the silicon substrate 100. The patterned photoresist may then be ashed away using oxygen ions or removed otherwise.

Figure 7:
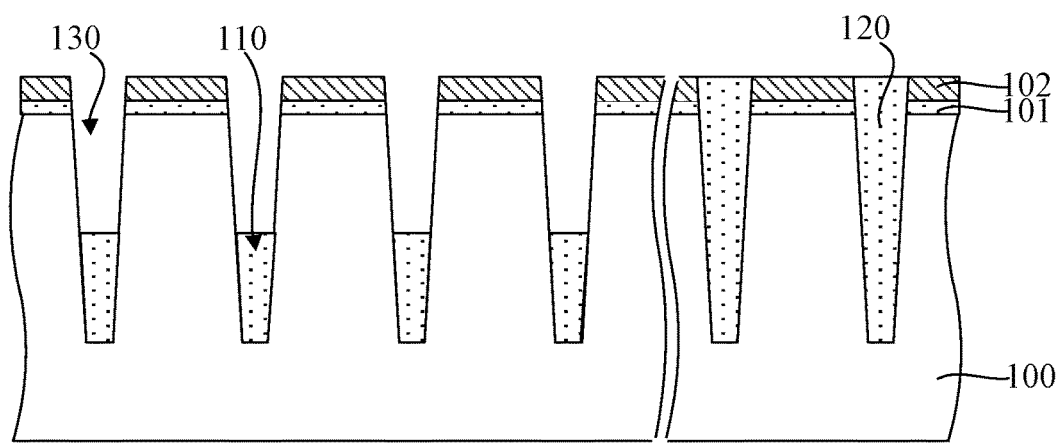

In step S200, with reference to FIG. 7, at least some of the first trenches 110 are partially filled with an insulating material 120 so that second trenches 130 are formed in the partially-filled first trenches 110.

Specifically, the insulating material 120 is deposited over the stop layer 102 so that the first trenches 110 are all filled with the insulating material 120. The insulating material 120 may then be planarized, for example, by CMP, until the stop layer 102 is exposed.

In fact, this process resembles a conventional process for forming shallow- or deep-trench isolations in a silicon substrate.

Thereafter, in some of the first trenches 110, the insulating material 120 is partially etched away to form a second trench 130 over the remaining thickness of the insulating material 120 in each of these first trenches 110. As shown in the figure, each of the second trenches 130 is located at an upper portion of a corresponding one of the first trenches 110. Therefore, the second trenches 130 are shallower than the first trenches 110 and are each bottomed with the insulating material 120.

While FIG. 7 schematically shows six first trenches 110 in the silicon substrate 100, in which only the leftmost four first trenches 110 experience partial removal of the insulating material 120, this is just for illustration and the silicon islands may be formed in arbitrary locations of the silicon substrate as desired according to practical needs without any constraints. The partially removal of the insulating material 120 in the selected first trenches 110 may be accomplished by spin-coating photoresist on the stop layer 102, patterning the photoresist by exposure and development processes so as to form a patterned photoresist. The patterned photoresist exposes the first trenches to be etched. With the patterned photoresist serving as a mask, the insulating material 120 in the exposed first trenches is partially etched away to form the corresponding second trenches 130. Following this, the patterned photoresist may be ashed away using oxygen ions or removed otherwise.

It is to be noted that while the second trenches 130 are formed in this embodiment by filling first trenches 110 with the insulating material and then partially etching away the insulating material. In alternative embodiments, they may also be formed directly by partially filling the first trenches 110.

Figure 8:
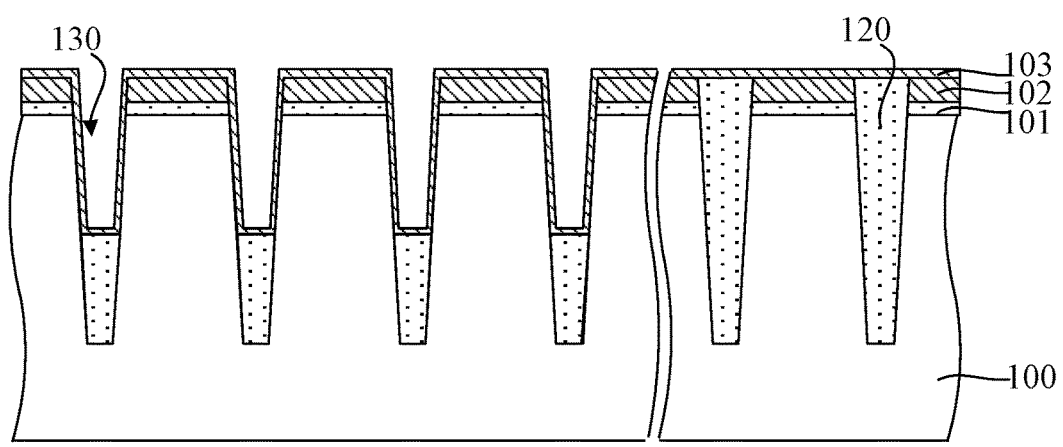

In step S300, with reference to FIG. 8, a protective layer 103 is formed on the silicon substrate 100, covering the stop layer 102 and the surfaces of the second trenches 130 (i.e., their sidewalls and bottom surfaces).

The protective layer 103 may be formed on the stop layer 102, for example, by chemical vapor deposition, of, but not limited to, silicon nitride so that it covers the stop layer 102 and the sidewalls and bottom surfaces of the second trenches 130. That is, the protective layer 103 covers the insulating material 120.

Figure 9:
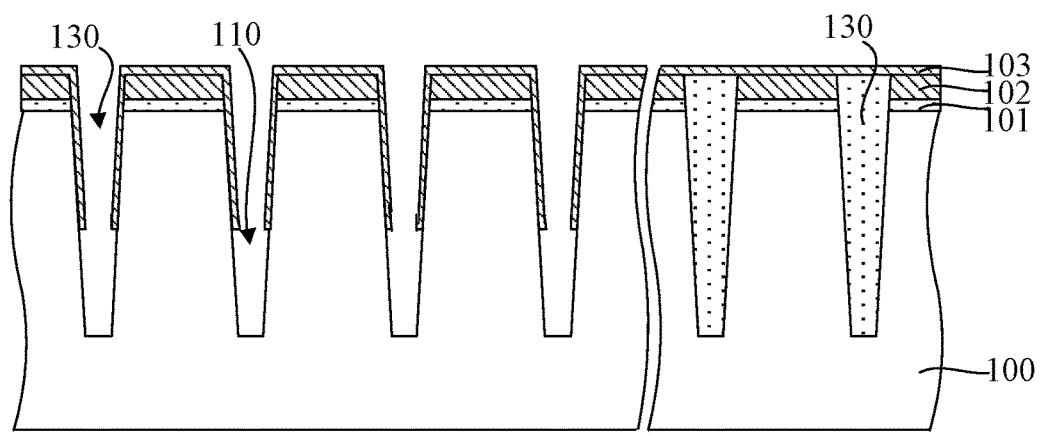

In step S400, with reference to FIG. 9, the protective layer 103 above the bottom surfaces of the second trenches 130 and the insulating material 120 underlying the second trenches 130 are removed, emptying the first trenches 110.

Specifically, the protective layer 103 over the bottom surfaces of the second trenches 130 may be removed by dry etching to expose the insulating material 120, with the remainder of the protective layer 103, i.e., the portion covering the stop layer 102 and the sidewalls of the second trenches 130 being retained. The insulating material 120 underlying the second trenches 130 may then be removed by wet etching to empty the corresponding first trenches 110. An etching solution used in the wet etching process may be selected based on the material of the insulating material 120. For example, if the insulating material 120 is made of silicon oxide, a diluted hydrofluoric acid (DHF) solution or a buffered hydrofluoric acid (BOE) solution may be selected to remove the insulating material 120 within the first trenches 110.

Figure 10:
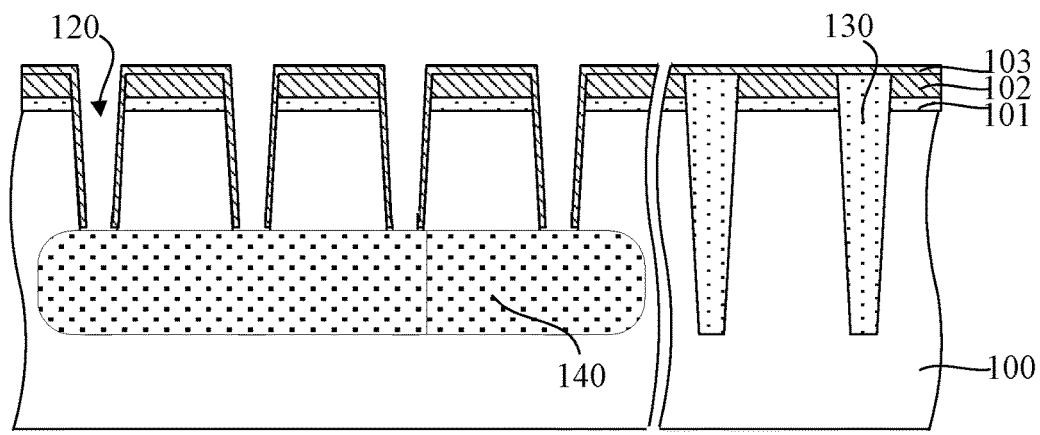

In step S500, with reference to FIG. 10, an oxidation process is performed on portions of the silicon substrate 100 exposed at the sidewalls of the corresponding first trenches 110 until the portions of the silicon substrate 100 between the sidewalls of the first trenches 110 (i.e., the sidewall portions not covered by the protective layer 103) are completely oxidized to form an oxide layer 140.

Specifically, a wet oxidation process may be performed on the portions of the silicon substrate 100 exposed at the sidewalls of the first trenches 110, i.e., the uncovered portions of the sidewalls of the first trenches 110, until the portions of the silicon substrate 100 between the uncovered portions are completely oxidized to form the oxide layer 140 which extends under the second trenches 130. In other words, the oxide layer 140 is formed by lateral oxidation of the portions of the silicon substrate 100 (i.e., horizontally in FIG. 9). As a result, as shown in FIG. 10, a portion of the silicon substrate 100 under the second trenches 130 in the leftmost four first trenches 110 is oxidized into the oxide layer.

Because of the protection by the protective layer 103, the sidewalls of the second trenches 130 are not oxidized. In other words, the oxide layer 140 entirely underlies the second trenches 130. Therefore, the depth of the oxide layer 140 within the silicon substrate 100 is determined by the depth of the second trenches 130 which is, in turn, determined by the removed thickness of the insulating material 120 in step S100 or by the remaining thickness of the insulating material 120. The remaining thickness of the insulating material 120 in S100 can be properly designed according to practical needs.

Of course, during the oxidation process performed on the silicon substrate 100 exposed at the sidewalls of the first trenches 110, i.e., the lateral oxidation process, the silicon substrate 100 exposed at the bottoms of the first trenches 110 will also be oxidized inevitably. As a result, the oxide layer 140 may have a thickness that is greater than the remaining thickness of the insulating layer 120 from step S200.

Figure 11:
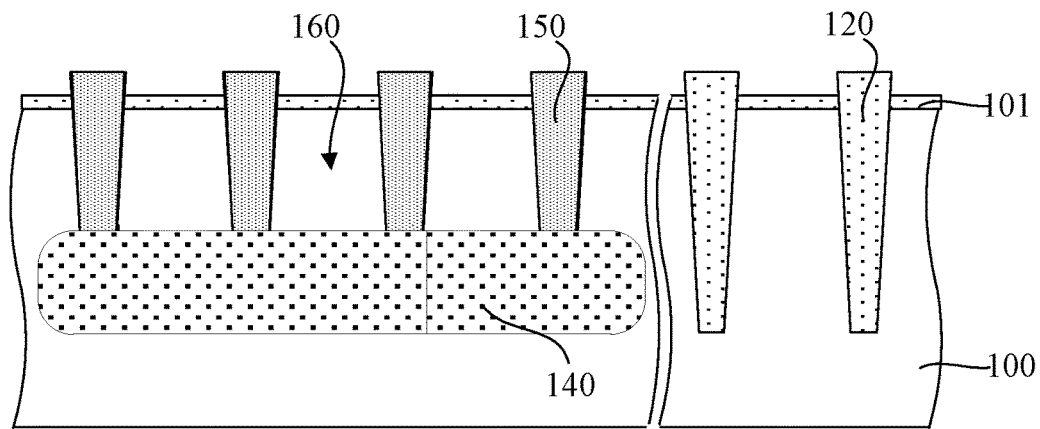

In step S600, the protective layer 103 over the sidewalls of the second trench 130 is removed, and in S700, the second trenches 130 are filled with an isolating material. As a result, isolations 150 are formed, with each portion of the silicon substrate 100 between adjacent isolations 150 defining a silicon island 160, as shown in FIG. 11.

Specifically, at first, the protective layer 103 over the sidewalls of the second trenches 130 may be removed, for example, by dry etching. Next, the isolating material may be deposited over the protective layer 103 on surface of the substrate 100 and fully fill the second trenches 130. Then the isolating material is planarized, for example, by CMP, until the protective layer 103 is exposed. Finally, the protective layer 103 and the stop layer 102 on the silicon substrate 100 may be etched away using a wet etching process, so that the isolations 150 are formed in the second trenches 130.

In this embodiment, since the protective layer 103 and the stop layer 102 are made of the same material such as, for example, silicon nitride, the portions of the protective layer 103 covering the sidewalls of the second trenches 130 are first removed, with the remainder of the protective layer over the silicon substrate 100 serving as a barrier for the subsequent polishing process. This is because, if the protective layer over the silicon substrate 100 were etched away at the same time, excessive etching would have inevitably occurred due to the same material from which they are fabricated. This can increase the difficulty of etching. Alternatively, if the protective layer 103 and the stop layer 102 are fabricated from different materials between which there is a high etch selectivity ratio, the part of the protective layer 103 over the silicon substrate 100 may be removed simultaneously with that covering the sidewalls of the second trenches 130 (i.e., the protective layer 103 is entirely removed in a single process), with the stop layer 102 instead providing the barrier for the subsequent polishing process.

The silicon islands 160 defined between the resulting trench isolations 150 are completely isolated from one another to an extent equal to that of silicon islands fabricated using a SOI technique.

In the method according to the above embodiment of the present invention, the plurality of first trenches 110 are first formed in the silicon substrate 100, and at least some of them are then partially filled with the insulating material 120 so as to form second trenches 120 in these first trenches. After that, the protective layer 103 is deposited which covers the sidewalls and bottom surfaces of the second trenches 130, followed by the removal of the protective layer over the bottom surfaces of the second trenches 130, as well as, of the insulating material 120 underlying the second trenches 130. An oxidation process is then performed on portions of the silicon substrate 100 exposed at the sidewalls of the first trenches 110 until the portions of the silicon substrate 100 between the sidewalls of the first trenches 110 that are not covered by the protective layer 103 are completely oxidized to form the oxide layer 140. Finally, the protective layer 103 covering the sidewalls of the second trenches 130 is removed and the second trenches 130 are filled with an isolating material, so that isolations 150 are formed, with portions of the silicon substrate 100 between them defining the silicon islands 160 that are isolated from one another. This method allows the formation of silicon islands at desired locations and with the same properties as those formed by a SOI technique, without introducing any additional process such as ion implantation, bonding or the like to the conventional technique. Therefore, significant reductions in process complexity and cost are achievable.

Correspondingly, the present invention further provides a silicon island structure made by the method as defined above, which includes, in an embodiment, as shown in FIG. 11:

a silicon substrate 100;

a plurality of isolations 150 located within the silicon substrate 100, which define portions of the silicon substrate 100 between them as silicon islands 160; and an oxide layer 140, which is present within at least a portion of the silicon substrate 100 under the isolations 150 and the silicon islands 160 and is in contact with the isolations 150.

Thus, each of the silicon islands 160 is surrounded by the oxide layer 140 and corresponding adjacent two of the isolations 150. Additionally, the silicon islands are completely isolated from one another and have the same properties as those formed by a SOI technique.

Preferably, the silicon island structure further includes a pad oxide layer 101 through which the isolations 150 penetrate.

In embodiments of the present invention, the isolations 150 are formed of, but not limited to, silicon oxide; the oxide layer 140 is formed of, but not limited to, silicon oxide; and the pad oxide layer 101 is formed of, but not limited to, silicon oxide. Therefore, the oxide layer 140, the isolations 150 and the pad oxide layer 101 made be made of the same material.

In embodiments of the present invention, a top surface of each of the isolations 150 is higher than a top surface of the pad oxide layer 101.

In summary, in the silicon island structure and method of fabricating same provided by the present invention, a plurality of first trenches are first formed in a silicon substrate, and at least some of the first trenches are then partially filled with an insulating material so as to form second trenches in these first trenches. After that, a protective layer is deposited over sidewalls of the second trenches in order to protect the underlying silicon substrate in a subsequent oxidation process which is performed on portions of the silicon substrate exposed at the sidewalls of the first trenches (i.e., at the portions of the sidewalls not protected by the protective layer) until the portions of the silicon substrate between the uncovered portions are completely oxidized. Finally, the protective layer covering the sidewalls of the second trenches is removed and the second trenches are filled with an isolating material so that isolations are formed, with each portion of silicon substrate between them defining a silicon island that is completely isolated from one another. With this method, silicon islands with the same properties as those formed by a SOI technique can be formed at desired locations without introducing any additional process such as ion implantation, bonding or the like to the conventional technique. Therefore, significant reductions in process complexity and cost are achievable.

The preferred embodiments presented above are merely examples and are in no way meant to limit the present invention. Any and all changes and modifications made by those of ordinary skill in the art based on the above teachings fall within the scope as defined in the appended claims.

What is claimed is:

1. A method for fabricating a silicon island structure, comprising the steps of:

providing a silicon substrate and forming a plurality of first trenches in the silicon substrate;

depositing an insulating material, the insulating material at least filling bottom portions of some of the first trenches such that second trenches are formed in the some of the first trenches;

forming a protective layer which covers the silicon substrate as well as sidewalls and a bottom surface of each of the second trenches;

removing, by etching, a portion of the protective layer over the bottom surface of each of the second trenches and a portion of the insulating material under each of the second trenches so as to expose the some of the first trenches;

performing an oxidation process at portions of the silicon substrate exposed at sidewalls of the some of the first trenches until the portions of the silicon substrate between portions of the sidewalls of the some of the first trenches that are not covered by the protective layer are completely oxidized, thereby forming an oxide layer;

removing the protective layer covering the sidewalls of each of the second trenches; and filling each of the second trenches with an isolating material so as to form an isolation therein, with each portion of the silicon substrate between the isolations defining a silicon island.

2. The method of claim 1, further comprising, prior to the formation of the plurality of first trenches, successively depositing a pad oxide layer and a stop layer over the silicon substrate.

3. The method of claim 2, wherein the formation of the plurality of first trenches comprises:

forming a patterned photoresist on the stop layer; and sequentially etching through, by using the patterned photoresist serving as a mask, the stop layer, the pad oxide layer and part of the silicon substrate to form the plurality of first trenches.

4. The method of claim 3, wherein the formation of the second trenches comprises:

depositing the insulating material over the silicon substrate such that the insulating material covers the stop layer and fills the plurality of first trenches;

planarizing the insulating material until the stop layer is exposed; and etching portions of the insulating material in the some of the first trenches until a certain thickness of the insulating material is remained, so as to form the second trenches in the some of the first trenches.

5. The method of claim 4, wherein each of the pad oxide layer, the insulating material and the isolating material is formed from a material including silicon oxide, and wherein each of the stop layer and the protective layer is formed from a material including silicon nitride.

6. The method of claim 1, wherein the portion of the protective layer over the bottom surface of each of the second trenches is removed by dry etching, and wherein the portion of the insulating material in each of the some of the first trenches is removed by wet etching.

7. The method of claim 1, wherein the oxidation process performed at the portions of the silicon substrate exposed at the sidewalls of the some of the first trenches is a wet oxidation process.

8. The method of claim 1, wherein the formation of the isolations by filling each of the second trenches with the isolating material comprises:

depositing the isolating material such that the isolating material covers the protective layer and fills each of the second trenches;

planarizing the isolating material until the protective layer is exposed; and removing the protective layer over the silicon substrate.

9. A silicon island structure fabricated by using the method as defined in claim 1, the silicon island structure comprising:

a silicon substrate;

a plurality of isolations located within the silicon substrate, wherein each portion of the silicon substrate between adjacent ones of the plurality of isolations is defined as a silicon island; and an oxide layer, which is present within at least a portion of the silicon substrate under the isolations and the silicon islands and is in contact with the isolations.

10. The silicon island structure of claim 9, further comprising a pad oxide layer through which the isolations penetrate.

11. The silicon island structure of claim 10, wherein a top surface of each of the isolations is higher than a top surface of the pad oxide layer.

* * * * *